(12) United States Patent
Lee (10) Patent No.: US 9,236,421 B2
(45) Date of Patent: Jan. 12, 2016

(54) IN-CELL ACTIVE MATRIX OLED TOUCH DISPLAY PANEL STRUCTURE OF NARROW BORDER

(71) Applicant: SuperC-Touch Corporation, New Taipei (TW)

(72) Inventor: Hsiang-Yu Lee, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 0 days.

(21) Appl. No.: 14/540,916

(22) Filed: Nov. 13, 2014

(65) Prior Publication Data

US 2015/0069373 A1    Mar. 12, 2015

Related U.S. Application Data (63) Continuation-in-part of application No. 14/455,697, filed on Aug. 8, 2014, now Pat. No. 9,153,629.

(30) Foreign Application Priority Data

Aug. 16, 2013  (TW) .................................. 102215428
Dec. 18, 2013  (TW) .................................. 102223895

(51) Int. Cl.
*H01L 27/32* (2006.01)
*G06F 3/041* (2006.01)
*G06F 3/044* (2006.01)

(52) U.S. Cl.
CPC .............. *H01L 27/323* (2013.01); *G06F 3/044* (2013.01); *G06F 3/0412* (2013.01); *H01L 27/3248* (2013.01)

(58) Field of Classification Search
None
See application file for complete search history.

(56) References Cited

U.S. PATENT DOCUMENTS

| 2006/0102461 A1* | 5/2006 | Cok  | G06F 3/045 200/512 |
| 2010/0123680 A1* | 5/2010 | Lee  | G06F 3/0412 345/174 |
| 2013/0093724 A1* | 4/2013 | Liu  | G06F 3/0412 345/174 |

* cited by examiner

*Primary Examiner* — Charles Garber
*Assistant Examiner* — Stanetta Isaac
(74) *Attorney, Agent, or Firm* — Muncy, Geissler, Olds & Lowe, P.C.

(57) ABSTRACT

An in-cell active matrix OLED touch panel structure of narrow border includes first and second substrates, an OLED layer configured between the first and second substrates, first and second sensing electrode layers, and a thin film transistor layer. The first sensing electrode layer includes M first conductor blocks and N connection lines arranged in a first direction. The second sensing electrode layer includes N second conductor blocks arranged in a second direction. Each second conductor block makes use of a corresponding i-th connection line to be extended to one edge of the panel structure. The thin film transistor layer includes K gate lines and L source lines. The M first conductor blocks, the N connection lines, and the N second conductor blocks are disposed at positions corresponding to those of the K gate lines and L source lines of the thin film transistor layer.

10 Claims, 8 Drawing Sheets

IN-CELL ACTIVE MATRIX OLED TOUCH DISPLAY PANEL STRUCTURE OF NARROW BORDER

CROSS REFERENCE TO RELATED APPLICATION

This application claims the benefits of the Taiwan Patent Application Serial Number 102223895, filed on Dec. 18, 2013, the subject matter of which is incorporated herein by reference.

This application is a continuation-in-part (CIP) of U.S. Patent application for an "In-cell OLED touch display panel structure of narrow border", U.S. application Ser. No. 14/455,697, filed on Aug. 8, 2014.

BACKGROUND OF THE INVENTION

1. Field of the Invention

The present invention relates to a display screen with a touch panel and, more particularly, to an in-cell active matrix OLED touch display panel structure of narrow border.

2. Description of Related Art

Modern consumer electronic apparatuses are typically equipped with touch panels for use as their input devices. According to different sensing manners, the touch panels can be classified into resistive type, capacitive type, acoustic type, and optical type.

The principle of touch panels is based on different sensing manners to detect a voltage, current, acoustic wave, or infrared to thereby detect the coordinates of touch points on a screen where a finger or other medium touches. For example, a resistive touch panel uses a potential difference between the upper and lower electrodes to compute the position of a pressed point for recognizing the touch location, and a capacitive touch panel uses a capacitance change generated in an electrostatic combination of the arranged transparent electrodes with a human body to generate a current or voltage for detecting touch coordinates.

With the widespread use of smart phones, the multi-touch technique is getting more and more important. Currently, the multi-touch is implemented by projected capacitive touch technique.

The projected capacitive touch technique makes use of two layers of indium tin oxide (ITO) to form a matrix of sensing units arranged in intersected columns and rows, so as to detect precise touch positions. The projected capacitive touch technique is based on capacitive sensing, wherein it designs plural etched ITO electrodes and adds plural sets of transparent conductor lines that are on different planes and vertical with each other to form X-axis and Y-axis driving lines. These conductor lines are all controlled by a controller for being sequentially scanned to detect capacitance changes that are sent to the controller.

Figure 1:
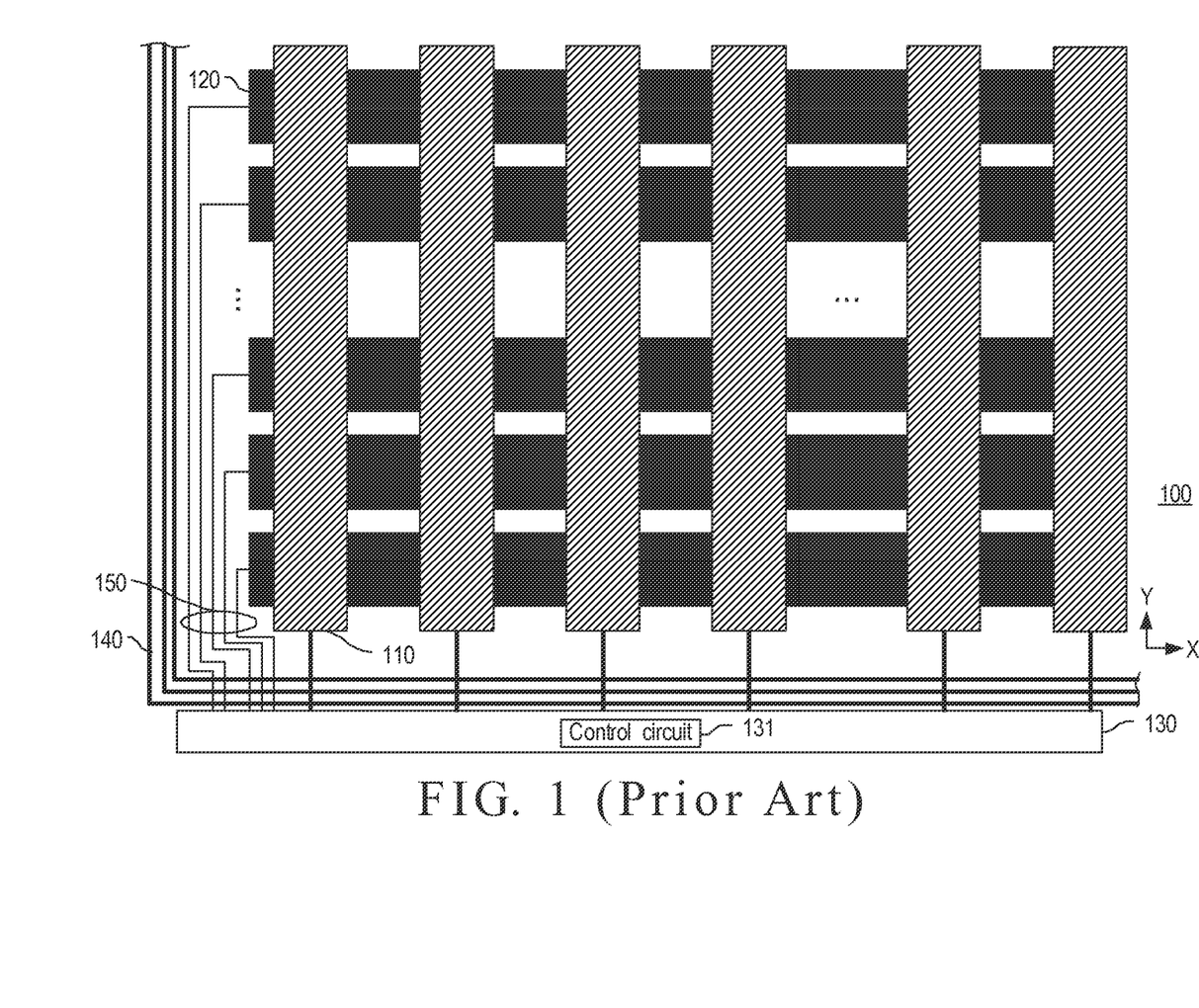
FIG. 1 is a schematic diagram of a prior touch panel structure.

FIG. 1 is a schematic diagram of a prior OLED touch display panel structure 100. On the prior OLED touch display panel structure 100, the sensing conductor lines 110, 120 are arranged in the first direction (Y-axis direction) and in the second direction (X-axis direction). When a touch sensing is being performed and the sensing conductor lines 120 have to transmit the sensed signals to the control circuit 131 on a flexible circuit board 130, a great amount of wires at the side of the panel 140 is required for connection to the flexible circuit board 130. Such a prior design increases the border width of the touch panel and thus is not suitable for the trend of narrow border.

Therefore, it is desirable to provide an improved OLED touch panel device to mitigate and/or obviate the aforementioned problems.

SUMMARY OF THE INVENTION

The object of the present invention is to provide an in-cell active matrix OLED touch panel structure of narrow border, in which the connection circuit is arranged at only one side of the panel while the other three sides are free from circuit connection so as to allow these three sides to be of narrow border design, thereby simplifying the arrangement of the touch panel and also increasing the accuracy of touch point detection.

In one aspect of the present invention, there is provided an in-cell active matrix OLED touch panel structure of narrow border, which comprises: a first substrate; a second substrate parallel to the first substrate;

an OLED layer configured between the first substrate and the second substrates; a first sensing electrode layer arranged on one side of the second substrate facing the OLED layer and including M first conductor blocks and N connection lines arranged in a first direction for touch detection, where M and N are each a positive integer; a second sensing electrode layer arranged on one side of the first sensing electrode layer facing the OLED layer and including N second conductor blocks arranged in a second direction for touch detection, wherein each second conductor block makes use of a corresponding i-th connection line to be extended to one edge of the in-cell active matrix OLED touch panel structure, where i is a positive integer and $1 \leq i \leq N$; and a thin film transistor layer disposed at one side of the second sensing electrode layer facing the OLED layer, the thin film transistor layer including K gate lines and L source lines for driving corresponding pixel transistor and pixel capacitor based on a display pixel signal and a display driving signal, so as to perform a display operation, where K and L are each a positive integer, wherein the M first conductor blocks, the N connection lines, and the N second conductor blocks are disposed at positions corresponding to those of the K gate lines and L source lines of the thin film transistor layer.

In another aspect of the present invention, there is provided an in-cell active matrix OLED touch panel structure of narrow border, which comprises; a first substrate; a second substrate parallel to the first substrate; an OLED layer configured between the first substrate and the second substrates; a second sensing electrode layer arranged on one side of the second substrate facing the OLED layer and including N second conductor blocks arranged in a second direction for touch detection, where N is a positive integer; a first sensing electrode layer arranged on one side of the second sensing electrode layer facing the OLED layer and including M first conductor blocks and N connection lines arranged in a first direction for touch detection, where M is a positive integer, wherein each second conductor block makes use of a corresponding i-th connection line to be extended to one edge of the in-cell active matrix °LED touch panel structure, where i is a positive integer and $1 \leq i \leq N$; a thin film transistor layer disposed at one side of the first sensing electrode layer facing the OLED layer, the thin film transistor layer including K gate lines and L source lines for driving corresponding pixel transistor and pixel capacitor based on a display pixel signal and a display driving signal, so as to perform a display operation, where K and L are each a positive integer, wherein the M first conductor blocks, the N connection lines, and the N second conductor blocks are disposed at positions corresponding to those of the K gate lines and L source lines of the thin film transistor layer.

Other objects, advantages, and novel features of the invention will become more apparent from the following detailed description when taken in conjunction with the accompanying drawings.

DETAILED DESCRIPTION OF THE PREFERRED EMBODIMENT

Figure 2:
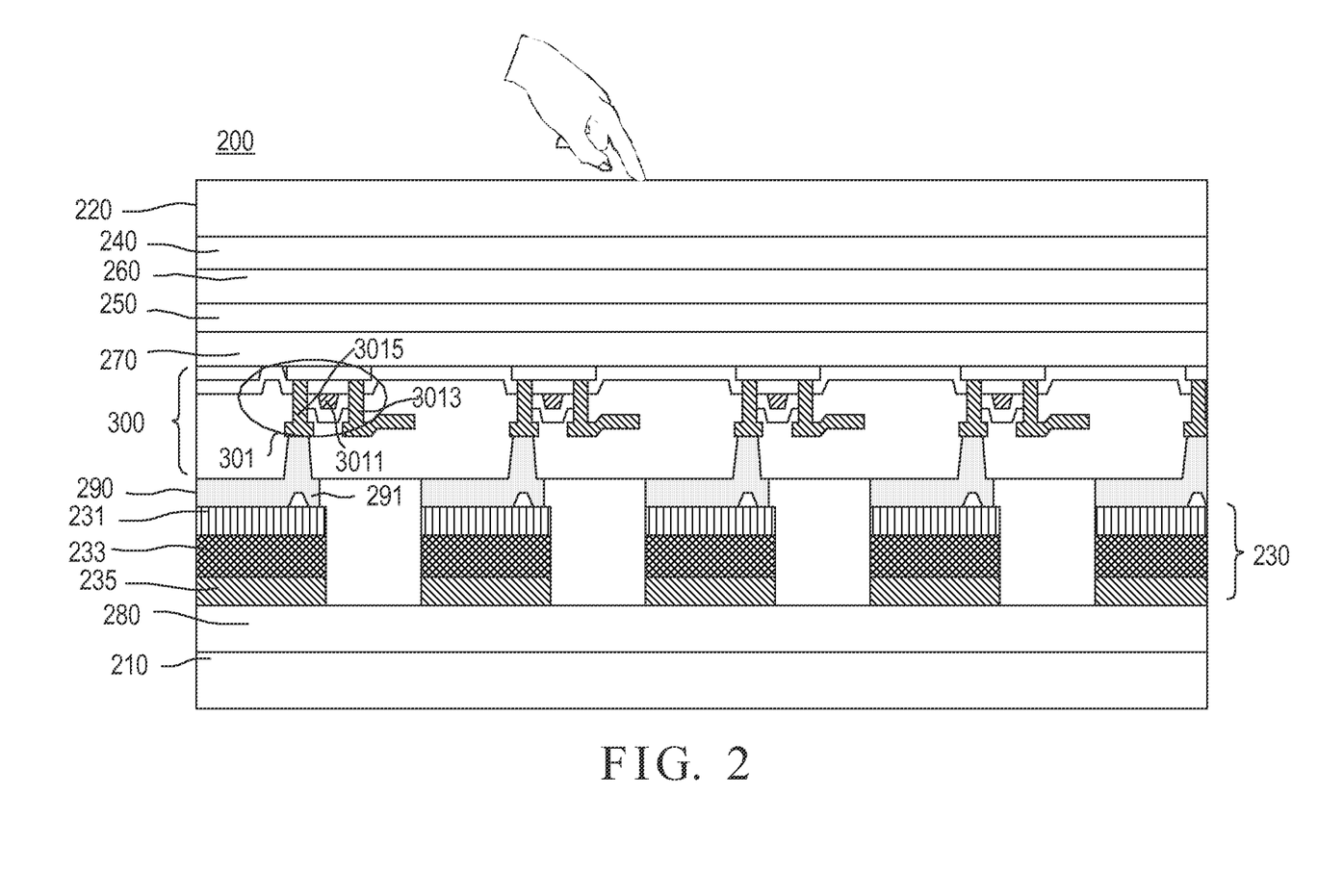
FIG. 2 is a stack diagram of an in-cell OLED touch display panel structure of narrow border in accordance with an embodiment of the present invention.

With reference to FIG. 2, there is shown a stack diagram of an in-cell active matrix OLED touch display panel structure of narrow border 200 in accordance with a preferred embodiment of the present invention. As shown, the in-cell active matrix OLED touch display panel structure of narrow border 200 includes a first substrate 210, a second substrate 220, an OLED layer 230, a first sensing electrode layer 240, a second sensing electrode layer 250, a first insulation layer 260, a second insulation layer 270, a cathode layer 280, an anode layer 290, and a thin film transistor (TFT) layer 300.

The first substrate 210 and the second substrate 220 are preferably glass substrates and are parallel to each other. The OLED layer 230 is disposed between the first and second substrates 210, 220. The second substrate 220 is generally known as a thin film transistor (TFT) substrate, and the thin film transistors used as switches are typically arranged on this TFT substrate. The display panel of the present invention is of a bottom illumination type, and thus a user's finger touches the second substrate 220, but not the first substrate 210.

Because the user's finger touches the second substrate 220, the sensing electrode layer should be close to the second substrate 220 for obtaining stronger touch sensing signals.

Figure 3:
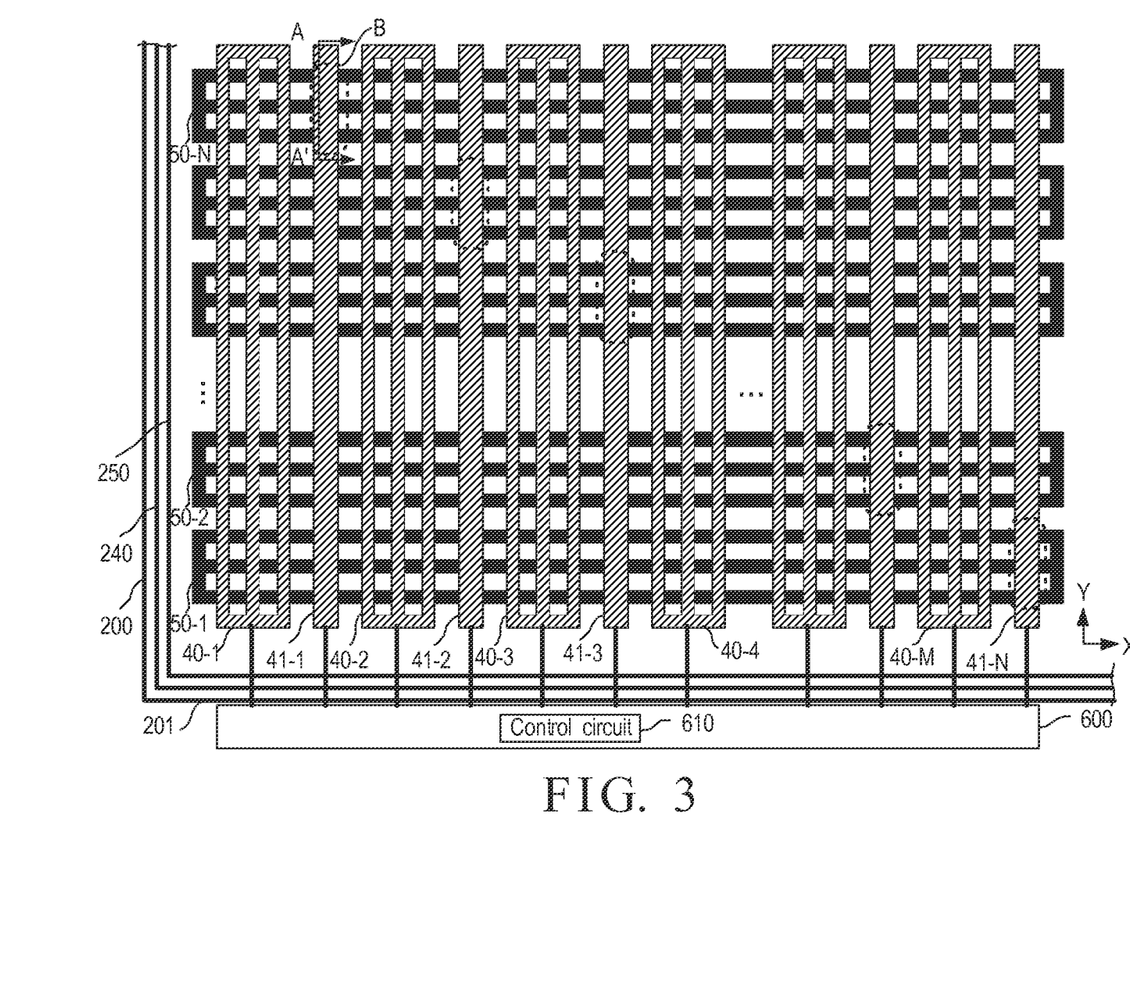
FIG. 3 schematically illustrates the conductor blocks and connection lines of the in-cell active matrix OLED touch display panel structure of narrow border in accordance with the present invention.

The first sensing electrode layer 240 is arranged on one side of the second substrate 220 facing the OLED layer 230 and, with reference to FIG. 3, the first sensing electrode layer 240 includes M first conductor blocks 40-1, 40-2, . . . , 40-M and N connection lines 41-1, 41-2, . . . , 41-N arranged in a first direction (Y-axis direction) for touch detection, where M and N are each a positive integer. In this embodiment, the M first conductor blocks 40-1, 40-2, . . . , 40-M and the N connection lines 41-1, 41-2, . . . , 41-N are made of conductive metal material.

The second sensing electrode layer 250 is disposed on one side of the first sensing electrode layer 240 facing the ° LED layer 230 and, with reference to FIG. 3, the second sensing electrode layer 250 includes N second conductor blocks 50-1, 50-2, . . . , 50-N arranged in a second direction (X-axis direction) for touch detection. Each of the second conductor blocks 50-1, 50-2, . . . , 50-N makes use of a corresponding i-th connection line (41-1, 41-2, . . . , 41-N) to be extended to one edge 201 of the in-cell active matrix OLED touch display panel structure 200, where i is a positive integer and 1≤i≤N. The first direction is substantially perpendicular to the second direction.

The thin film transistor layer 300 is disposed at one side of the second sensing electrode layer 250 that faces the OLED layer 230. The thin film transistor layer 300 includes K gate lines and L source lines, wherein. K and L are positive integers. The gate lines and source lines are well-known to those skilled in the art of display panel, and thus are not shown in the figures. Based on a display pixel signal and a display driving signal, corresponding pixel transistor and pixel capacitor are driven so as to proceed with display operation. The M first conductor blocks 40-1, 40-2, . . . , 40-M, the N connection lines 41-1, 41-2, . . . , 41-N and the N second conductor blocks 50-1, 50-2, . . . , 50-N are disposed at positions corresponding to the positions of the K gate lines and the L source lines.

The second insulation layer 270 is arranged between the thin film transistor layer 300 and the second sensing electrode layer 250.

FIG. 3 schematically illustrates the conductor blocks and connection lines of the in-cell active matrix OLED touch display panel structure of narrow border in accordance with the present invention. As shown, each of the M first conductor blocks 40-1, 40-2, . . . , 40-M and the N second conductor blocks 50-1, 50-2, . . . , 50-N is composed of plural metal sensing lines. The M first conductor blocks 40-1, 40-2, . . . , 40-M and the N second conductor blocks 50-1, 50-2, . . . , 50-N are not electrically connected with each other. Preferably, an insulation layer 260 is arranged between the first sensing electrode layer 240 and the second sensing electrode layer 250. Alternatively, it is also applicable to arrange insulation traces or insulation blocks in-between the intersections of the M first conductor blocks 40-1, 40-2, . . . , 40-M and the N second conductor blocks 50-1, 50-2, . . . , 50-N.

The plural metal sensing lines of each conductor block of the M first conductor blocks 40-1, 40-2, . . . , 40-M and the N second conductor blocks 50-1, 50-2, . . . , 50-N form a quadrilateral region. The metal sensing lines in each quadrilateral region are electrically connected together, while any two of the quadrilateral regions are not connected with each other. The quadrilateral region has a shape of rectangle or square.

Each of the N connection lines 41-1, 41-2, . . . , 41-N is disposed between two first conductor blocks (40-1, 40-2, . . . , 40-M).

The plural metal sensing lines in each quadrilateral region formed by the plural metal sensing lines of each of the M first conductor blocks 40-1, 40-2, . . . , 40-M and the N second conductor blocks 50-1, 50-2, . . . , 50-N are made of conductive metal material or alloy material. The conductive metal material is selectively to be chromium, barium, aluminum, silver, copper, titanium, nickel, tantalum, cobalt, tungsten, magnesium, calcium, potassium, lithium, indium, and their alloy.

As shown in FIG. 3, each of the second conductor blocks 50-1, 50-2, . . . , 50-N is electrically connected with a corresponding connection line (41-1, 41-2, ..., 41-N) at a position denoted by a dotted ellipse, and each of the N connection lines 41-1, 41-2, ..., 41-N is extended to the same edge 201 of the in-cell active matrix OLED touch display panel structure 200 through a corresponding metal wire for being further connected to the flexible circuit board 600. Each of the first conductor blocks 40-1, 40-2, ..., 40-M is extended to the same edge 201 of the in-cell active matrix OLED touch display panel structure 200 through a corresponding metal wire for being further connected to the flexible circuit board 600.

The surface of the in-cell active matrix OLED touch display panel structure 200 is provided to receive at least one touch point. There is further provided with a control circuit 610 which is electrically connected to the M first conductor blocks 40-1, 40-2, ..., 40-M and the N second conductor blocks 50-1, 50-2, ..., 50-N via the flexible circuit board 600.

The M first conductor blocks 40-1, 40-2, ..., 40-M and the N second conductor blocks 50-1, -2, ..., 50-N correspondingly generate a sensing signal in response to the position of a finger's touch on at least one touch point of the in-cell active matrix °LED touch display panel structure 200. The control circuit 610 is electrically connected to the M first conductor blocks 40-1, 40-2, ..., 40-M and the N second conductor blocks 50-1, 50-2, ..., 50-N via the flexible circuit board 600, so as to calculate the coordinate of the at least one touch point based on the sensing signal.

Figure 4:
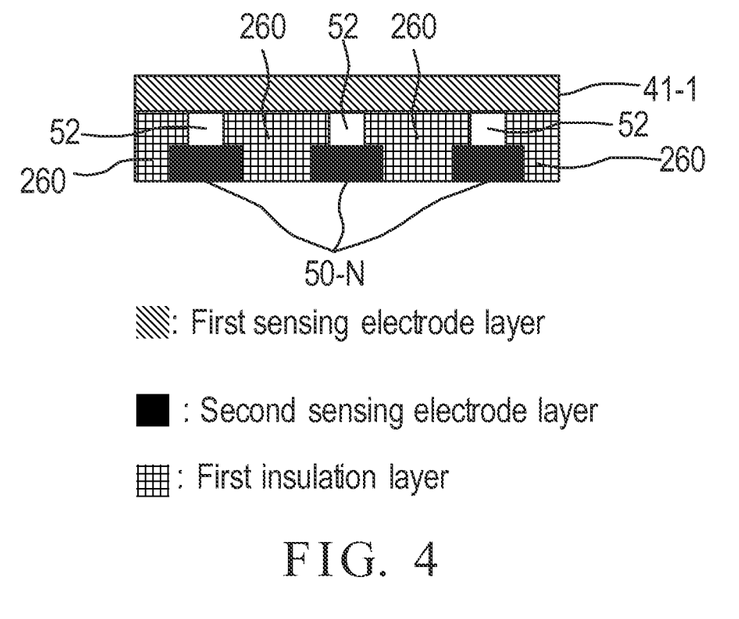
FIG. 4 is a cross sectional view taking along A-A' line of FIG. 3.

FIG. 4 is a cross sectional view taking along A-A' line of FIG. 3. As shown in HG 4, the second conductor block 50-N is electrically connected with the connection line 41-1 at the position denoted by the clotted ellipse B of FIG. 3. With reference to FIGS. 2 and 4, the first insulation layer 260 is arranged between the first sensing electrode layer 240 and the second sensing electrode layer 250, and the second conductor block 50-N is electrically connected to the connection line 41-1 through a via 52 that passes through the first insulation layer 260. That is, with the connection line 41-1, the second conductor block 50-N is able to transmit the sensed signal to the control circuit 610.

Figure 5:
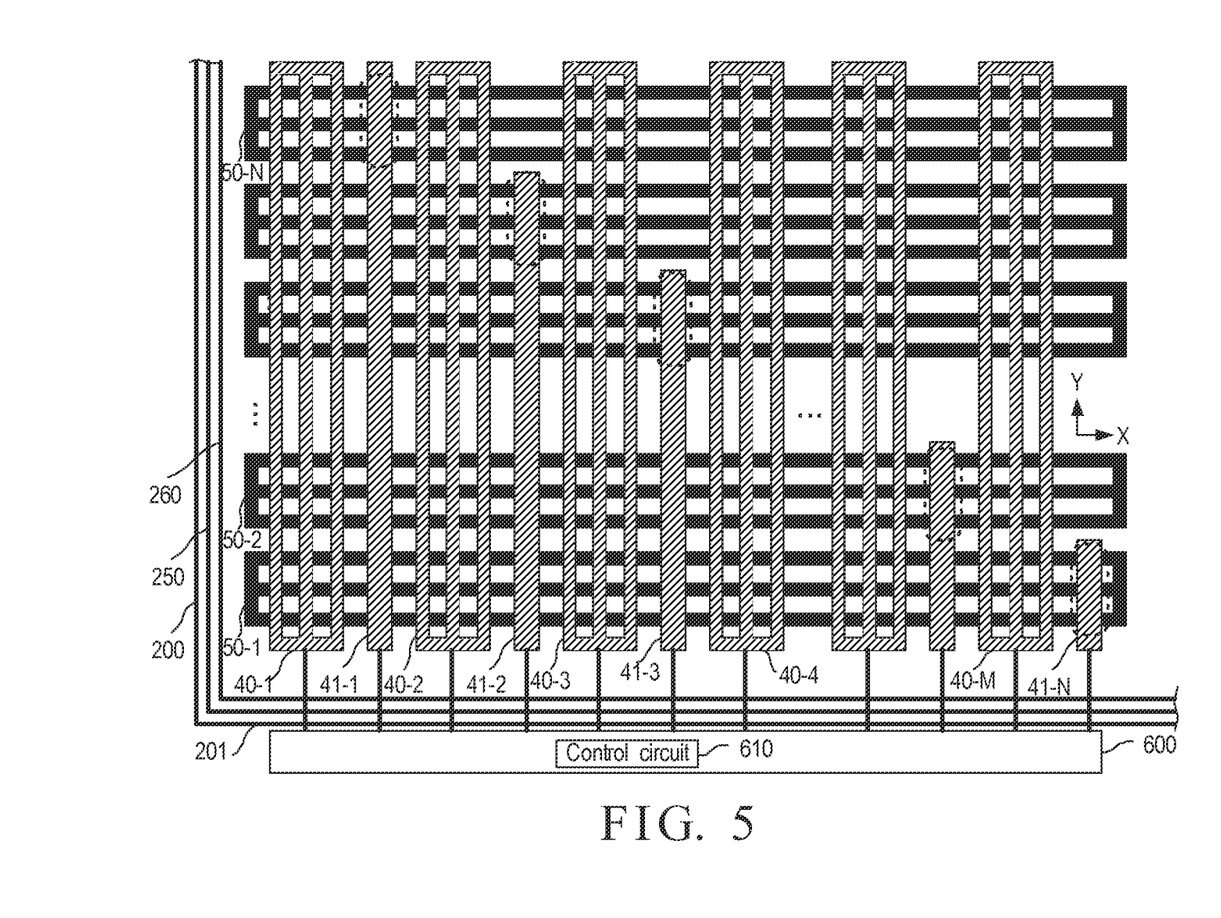
FIG. 5 is another schematic diagram of the conductor blocks and connection lines of the in-cell active matrix OLED touch display panel structure of narrow border in accordance with the present invention.

FIG. 5 is another schematic diagram of the conductor blocks and connection lines of the in-cell active matrix OLED touch display panel structure of narrow border in accordance with the present invention, which is similar to FIG. 3 except that the N connection lines 41-1, 41-2, ..., 41-N have different lengths. As shown, the lengths of the N connection lines 41-1, 41-2, ..., 41-N are gradually decreased in this embodiment.

Figure 6:
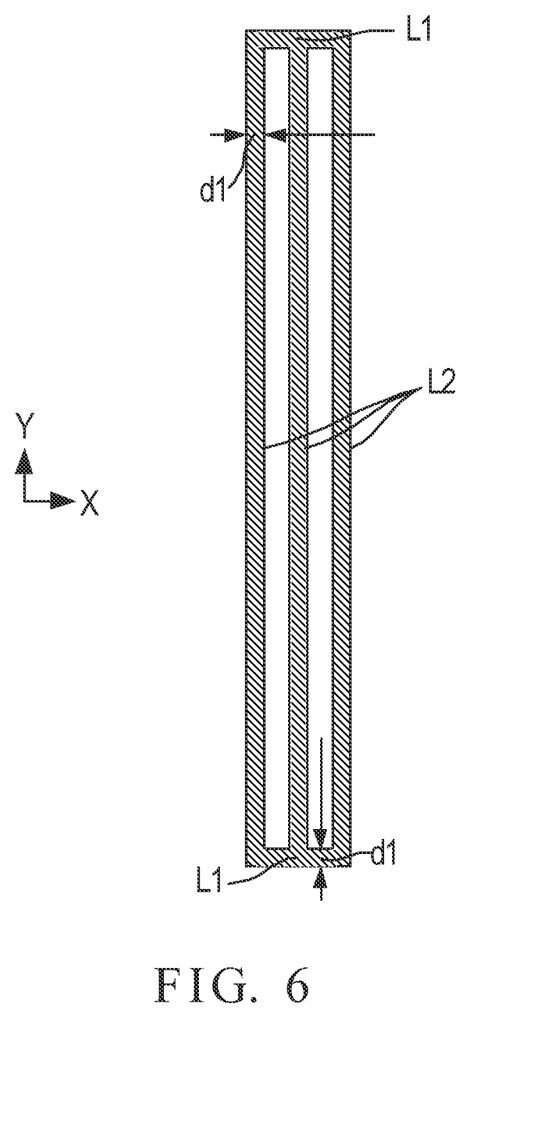
FIG. 6 is a schematic diagram of a first conductor block.

FIG. 6 is a schematic diagram of a first conductor block (40-1, 40-2, ..., 40-M). As shown, the quadrilateral region is a rectangle composed of three metal sensing lines L2 in the first direction and two metal sensing lines L1 in a second direction. In other embodiments, the number of metal sensing lines can be varied according to the actual requirement.

The line width (d1) of the metal sensing line L1 or L2 is preferred to be smaller than or equal to the line width of the gate line or source line of the thin film transistor layer 300. The M first conductor blocks 40-1, 40-2, ..., 40-M, the N connection lines 41-1, 41-2, ..., 41-N, and the N second conductor blocks 50-1, 50-2, ..., 50-N are disposed at positions corresponding to the positions of the gate lines and source lines of the thin film transistor layer 300. Therefore, when viewing from the second substrate 220 to the first substrate 210, the M first conductor blocks 40-1, 40-2, ..., 40-M, the N connection lines 41-1, 41-2, ..., 41-N, and the N second conductor blocks 50-1, 50-2, ..., 50-N are disposed at positions right above the positions of the K gate lines and L source lines of the thin film transistor layer 300, so as not to conceal the illumination area and reduce the aperture rate.

The first insulation layer 260 is arranged between the first sensing electrode layer 240 and the second sensing electrode layer 250.

The thin film transistor layer 300 is disposed at one side of the second sensing electrode layer 250 that faces the OLED layer 230. The thin film transistor layer 300 includes K gate lines and L source lines, wherein K and L are positive integers. The gate lines and source lines are well-known to those skilled in the art of display panel, and thus are not shown in the figures. Based on a display pixel signal and a display driving signal, corresponding pixel transistor and pixel capacitor are driven so as to proceed with display operation.

In addition to the gate lines and source lines, the thin film transistor layer 300 further includes a plurality of pixel driving circuits 301. Based on a display pixel signal and a display driving signal, the thin film transistor layer 300 drives a corresponding pixel driving circuit 301 so as to proceed with display operation.

According to different designs of the pixel driving circuit 301, such as 2T1C being a pixel driving circuit formed with two thin film transistors and a storage capacitor, and 6T2C being a pixel driving circuit formed with six thin film transistors and two storage capacitors. The gate 3011 of at least one thin film transistor in the pixel driving circuit 301 is connected to a gate line (not shown). According to different designs of driving circuit, a source/drain 3013 of at least one thin film transistor in a control circuit is connected to a source line (not shown) and a source/drain 3015 of at least one thin film transistor in pixel driving circuit 301 is connected to a corresponding anode pixel electrode 291 of the anode layer 290.

The cathode layer 280 is disposed at one side of the first substrate 210 facing the OLED layer 230 and between the first substrate 210 and the OLED layer 230. The cathode layer 280 is made of conductive metal material. The metal material is selectively to be aluminum, silver, magnesium, calcium, potassium, lithium, indium, their alloy, or combination of lithium fluoride, magnesium fluoride, lithium oxide and aluminum. Due to the cathode layer 280 being of metal material, the light generated by the OLED layer 230 will be reflected, so as to emit most of the light toward the second substrate 220, thereby forming a bottom illumination type display.

The light generated by the OLED layer 230 is reflected to display image on the second substrate 220. The cathode layer 280 is intact piece electrical connection, so that it can be used as a shielding. Moreover, the cathode layer 280 also receives the current coming from the anode pixel electrode 291.

The anode layer 290 is disposed at one side of the thin film transistor layer 300 facing the OLED layer 230. The anode layer 290 includes a plurality of anode pixel electrodes 291. Each of the anode pixel electrodes 291 is corresponding to one pixel driving transistor of the pixel driving circuit 301 of the thin film transistor layer 300. That is, each of the anode pixel electrodes is connected to a source/drain 3015 of the pixel driving transistor of the corresponding pixel driving circuit 301, so as to form a pixel electrode of a specific color, for example a red pixel electrode, a green pixel electrode, a blue pixel electrode, or a white pixel electrode.

The OLED layer 230 includes a hole transporting layer 231, an emitting layer 233, and an electron transporting layer 235. The OLED layer 230 preferably emits light of red, blue and green primary colors.

Figure 7:
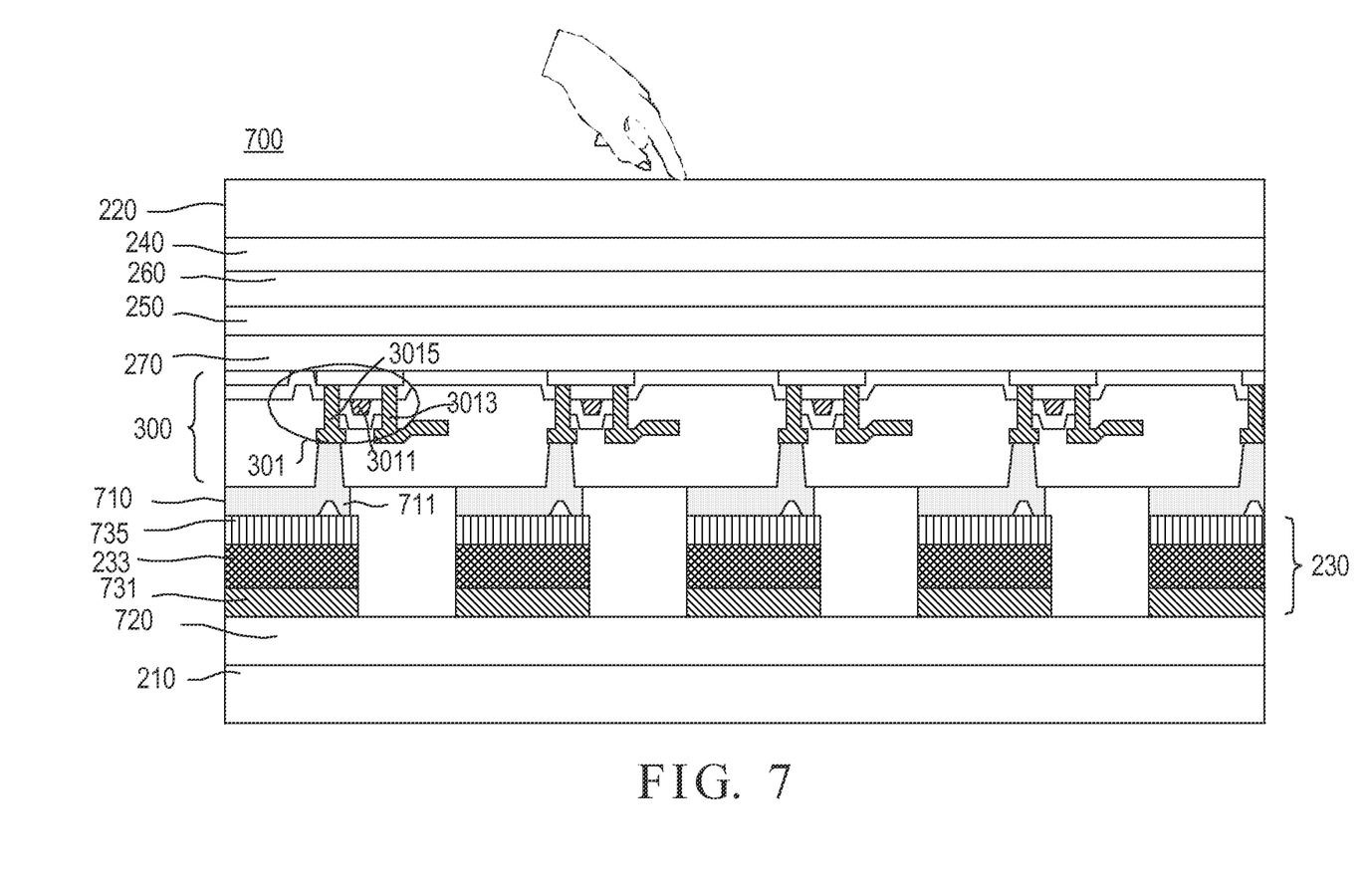
FIG. 7 is a stack diagram of an in-cell OLED touch display panel structure of narrow border in accordance with another embodiment of the present invention.

FIG. 7 is a stack diagram of an in-cell active matrix OLED touch display panel structure of narrow border 700 in accordance with another embodiment of the present invention, which is similar to the in-cell active matrix OLED touch display panel structure of FIG. 2 except that the positions of the cathode layer 710 and the anode layer 720 are exchanged to each other. The cathode layer 710 includes a plurality of cathode pixel electrodes 711. Each of the cathode pixel electrodes 711 is corresponding to one pixel driving transistor of the pixel driving circuit 301 of the thin film transistor layer 300. That is, each of the cathode pixel electrodes is connected to a source/drain 3015 of the pixel driving transistor of the corresponding pixel driving circuit 301, so as to form a pixel electrode of a specific color, for example a red pixel electrode, a green pixel electrode, a blue pixel electrode, or a white pixel electrode.

As shown in FIG. 7, the positions of the cathode layer 710 and the anode layer 720 are exchanged to each other. In order to match with the positions of cathode layer 710 and the anode layer 720, the positions of the hole transporting layer 731 and the electron transporting layer 735 are also exchanged to each other. The cathode layer 710 includes a plurality of cathode pixel electrodes 711. Each of the cathode pixel electrodes 711 is connected to a source/drain of the pixel driving transistor of the corresponding pixel driving circuit.

Figure 8:
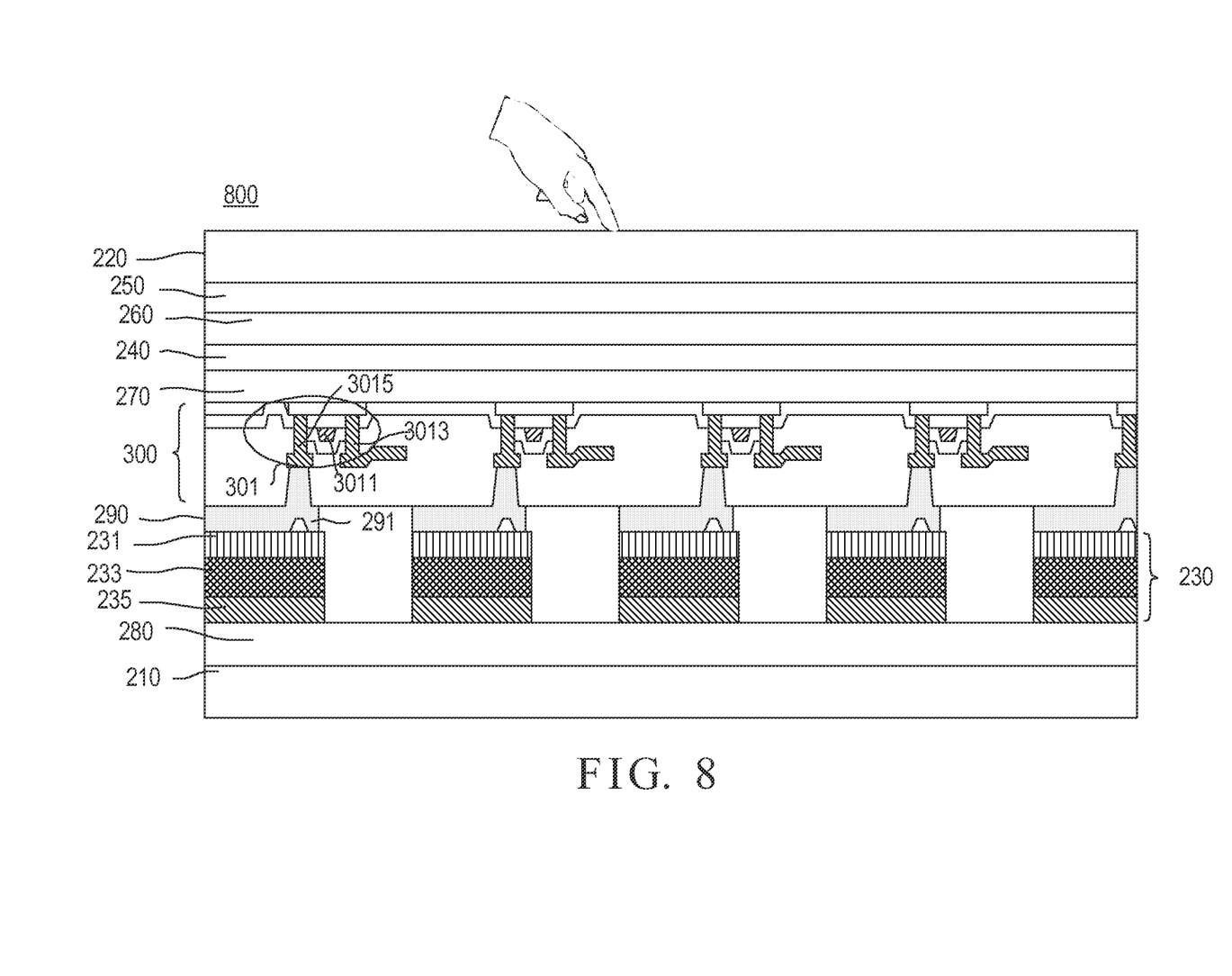
FIG. 8 is a stack diagram of an in-cell OLED touch display panel structure of narrow border in accordance with still another embodiment of the present invention.

FIG. 8 is a stack diagram of an in-cell active matrix OLED touch display panel structure of narrow border 800 in accordance with still another embodiment of the present invention, which is similar to the in-cell active matrix OLED touch display panel structure of FIG. 2 except that the positions of the first sensing electrode layer 240 and the second sensing electrode layer 250 are exchanged to each other. That is, the second sensing electrode layer 250 is disposed at one side of the second substrate 220 facing the OLED layer 230. Preferably, the second sensing electrode layer 250 is disposed at the surface of the second substrate 220 facing the OLED layer 230. The first sensing electrode layer 240 is disposed at one side of the second sensing electrode layer 250 facing the OLED layer 230.

In the prior art, the electrode pads made of ITO have an average light penetration rate of about 90%. In the present invention, the M first conductor blocks 40-1, 40-2, ..., 40-M, the N connection lines 41-1, 41-2, ..., 41-N, and the N second conductor blocks 50-1, 50-2, ..., 50-N are disposed at positions above the positions of the K gate lines and L source lines of the thin film transistor layer 300, so that the light penetration rate is not influenced. Therefore, the light penetration rate of the present invention is much better than that of the prior art. Accordingly, in comparison with the prior touch display panel, the in-cell active matrix OLED touch display panel structure in accordance with the present invention shall have a higher brightness.

In view of the forgoing, it is known that the prior art, as shown in FIG. 1, will increase the border width of touch display panel and thus is not suitable for the trend of narrow border design. On the contrary, the present invention not only is suitable for narrow border design but also provides a higher brightness.

Moreover, in the present invention, the M first conductor blocks 40-1, 40-2, ..., 40-M, the N second conductor blocks 50-1, 50-2, ..., 50-N and the N connection lines 41-1, 41-2, ..., 41-N are all made of metal material, which has a better conductivity in comparison with the prior art, so as to easily transmit the sensed signals of the connection lines to the control circuit, thereby allowing the control circuit to accurately compute the touch coordinates. Accordingly, it is known that the present invention has a better light penetration rate in comparison with the prior art and can lower the manufacturing cost by avoiding the use of expensive ITO material, which is suitable for the touch display panel of narrow border.

Although the present invention has been explained in relation to its preferred embodiment, it is to be understood that many other possible modifications and variations can be made without departing from the spirit and scope of the invention as hereinafter claimed.

What is claimed is:

1. An in-cell active matrix OLED touch panel structure of narrow border, comprising:
   a first substrate;
   a second substrate parallel to the first substrate;
   an OLED layer configured between the first substrate and the second substrates;
   a first sensing electrode layer arranged on one side of the second substrate facing the OLED layer and including M first conductor blocks and N connection lines arranged in a first direction for touch detection, where M and N are each a positive integer;
   a second sensing electrode layer arranged on one side of the first sensing electrode layer facing the OLED layer and including N second conductor blocks arranged in a second direction for touch detection, wherein each second conductor block makes use of a corresponding i-th connection line to be extended to one edge of the in-cell active matrix OLED touch panel structure, where i is a positive integer and $1 \leq i \leq N$; and
   a thin film transistor layer disposed at one side of the second sensing electrode layer facing the OLED layer, the thin film transistor layer including K gate lines and L source lines for driving corresponding pixel transistor and pixel capacitor based on a display pixel signal and a display driving signal, so as to perform a display operation, where K and L are each a positive integer,
   wherein the M first conductor blocks, the N connection lines, and the N second conductor blocks are disposed at positions corresponding to those of the K gate lines and L source lines of the thin film transistor layer, wherein each of the first conductor blocks is extended to the same edge of the panel structure through a corresponding metal wire for being further connected to a flexible circuit board.

2. The in-cell active matrix OLED touch panel structure of narrow border as claimed in claim 1, wherein the N connection lines are made of conductive metal material.

3. The in-cell active matrix OLED touch panel structure of narrow border as claimed in claim 2, wherein each of the M first conductor blocks and the N second conductor blocks is composed of plural metal sensing lines.

4. The in-cell active matrix OLED touch panel structure of narrow border as claimed in claim 3, wherein the plural metal sensing lines of each of the M first conductor blocks and the N second conductor blocks form a quadrilateral region, such that the metal sensing lines in each quadrilateral region are electrically connected together, while any two of the quadrilateral regions are not connected with each other.

5. The in-cell active matrix OLED touch panel structure of narrow border as claimed in claim 4, wherein the first direction is substantially perpendicular to the second direction.

6. The in-cell active matrix OLED touch panel structure of narrow border as claimed in claim 5, wherein each of the N connection lines is disposed between two first conductor blocks.

7. The in-cell active matrix OLED touch panel structure of narrow border as claimed in claim 6, wherein the quadrilateral region has a shape of rectangle or square.

8. The in-cell active matrix OLED touch panel structure of narrow border as claimed in claim 7, wherein the metal sensing lines in each quadrilateral region formed by the plural metal sensing lines of each of the M first conductor blocks and the N second conductor blocks are made of conductive metal material or alloy material.

9. The in-cell active matrix OLED touch panel structure of narrow border as claimed in claim 8, wherein the conductive metal material is selectively to be chromium, barium, aluminum, silver, copper, titanium, nickel, tantalum, cobalt, tungsten, magnesium, calcium, potassium, lithium and indium.

10. An in-cell active matrix OLED touch panel structure of narrow border, comprising:
- a first substrate;
- a second substrate parallel to the first substrate;
- an OLED layer configured between the first substrate and the second substrates;
- a second sensing electrode layer arranged on one side of the second substrate facing the OLED layer and including N second conductor blocks arranged in a second direction for touch detection, where N is a positive integer;
- a first sensing electrode layer arranged on one side of the second sensing electrode layer facing the OLED layer and including M first conductor blocks and N connection lines arranged in a first direction for touch detection, where M is a positive integer, wherein each second conductor block makes use of a corresponding i-th connection line to be extended to one edge of the in-cell active matrix OLED touch panel structure, where i is a positive integer and $1 \le i \le N$; and
- a thin film transistor layer disposed at one side of the first sensing electrode layer facing the OLED layer, the thin film transistor layer including K gate lines and L source lines for driving corresponding pixel transistor and pixel capacitor based on a display pixel signal and a display driving signal, so as to perform a display operation, where K and L are each a positive integer,
wherein the M first conductor blocks, the N connection lines, and the N second conductor blocks are disposed at positions corresponding to those of the K gate lines and L source lines of the thin film transistor layer.

* * * * *